(12) United States Patent
Park et al.

(10) Patent No.: US 10,263,154 B2
(45) Date of Patent: Apr. 16, 2019

(54) LIGHT-EMITTING DEVICE AND LIGHT-EMITTING DEVICE PACKAGE COMPRISING SAME

(71) Applicant: LG INNOTEK CO., LTD., Seoul (KR)

(72) Inventors: Su Ik Park, Seoul (KR); Min Sung Kim, Seoul (KR); Youn Joon Sung, Seoul (KR); Yong Gyeong Lee, Seoul (KR); Kwang Yong Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 15/749,069

(22) PCT Filed: Aug. 25, 2016

(86) PCT No.: PCT/KR2016/009444
§ 371 (c)(1),
(2) Date: Jan. 30, 2018

(87) PCT Pub. No.: WO2017/034346
PCT Pub. Date: Mar. 2, 2017

(65) Prior Publication Data
US 2018/0226542 A1 Aug. 9, 2018

(30) Foreign Application Priority Data
Aug. 27, 2015 (KR) ........................ 10-2015-0120843

(51) Int. Cl.
*H01L 33/00* (2010.01)
*H01L 33/38* (2010.01)
(Continued)

(52) U.S. Cl.
CPC ............ *H01L 33/382* (2013.01); *H01L 33/06* (2013.01); *H01L 33/12* (2013.01); *H01L 33/22* (2013.01);
(Continued)

(58) Field of Classification Search
USPC ......... 257/41, 81, 82, 91, 99, 100, 116, 117, 257/432–437, 749, E33.056–E33.059,
(Continued)

(56) References Cited

U.S. PATENT DOCUMENTS

2011/0260205 A1 10/2011 Moosburger et al.
2015/0144984 A1* 5/2015 Chen ...................... H01L 33/08
257/99

FOREIGN PATENT DOCUMENTS

JP 2012-060115 3/2012
JP 2013-528953 7/2013
(Continued)

OTHER PUBLICATIONS

International Search Report (with English Translation) and Written Opinion dated Nov. 25, 2016 issued in Application No. PCT/KR2016/009444.

*Primary Examiner* — Niki H Nguyen
(74) *Attorney, Agent, or Firm* — KED & Associates, LLP

(57) ABSTRACT

An embodiment relates to a light-emitting device comprising: a light-emitting structure which comprises a first conductive semiconductor layer, a second conductive semiconductor layer, and an active layer disposed between the first conductive semiconductor layer and the second conductive semiconductor layer, and comprises a plurality of first recesses passing through the second conductive semiconductor layer and active layer and disposed on a part of an area of the first conductive semiconductor layer; a first electrode which is electrically connected to the first conductive semiconductor layer inside the plurality of first recesses; a conductive support substrate which is electrically connected to the first electrode; a second electrode which is electrically connected to the second conductive semiconductor layer; and an insulating layer which is disposed between the conductive support substrate and second con-
(Continued)

ductive semiconductor layer, wherein a second recess passes through the first conductive semiconductor layer, second conductive semiconductor layer and active layer and is disposed on a part of an area of the insulating layer.

20 Claims, 6 Drawing Sheets

(51) Int. Cl.
| | |
|---|---|
| *H01L 33/12* | (2010.01) |
| *H01L 33/26* | (2010.01) |
| *H01L 33/36* | (2010.01) |
| *H01L 33/06* | (2010.01) |
| *H01L 33/22* | (2010.01) |
| *H01L 33/30* | (2010.01) |
| *H01L 33/32* | (2010.01) |
| *H01L 33/44* | (2010.01) |
| *H01L 33/48* | (2010.01) |
| *H01L 33/62* | (2010.01) |
| *H01L 33/40* | (2010.01) |
| *H01L 33/42* | (2010.01) |

(52) U.S. Cl.
CPC .............. *H01L 33/26* (2013.01); *H01L 33/30* (2013.01); *H01L 33/32* (2013.01); *H01L 33/36* (2013.01); *H01L 33/44* (2013.01); *H01L 33/486* (2013.01); *H01L 33/62* (2013.01); *H01L 33/405* (2013.01); *H01L 33/42* (2013.01)

(58) Field of Classification Search
USPC ....... 257/E25.032; 438/2–28, 51, 55, 64–68, 438/83, 98
See application file for complete search history.

(56) References Cited

FOREIGN PATENT DOCUMENTS

| KR | 10-2012-0040855 | 4/2012 |
|---|---|---|
| KR | 10-2015-0060405 | 6/2015 |
| KR | 10-2016-0016346 | 2/2016 |

* cited by examiner

LIGHT-EMITTING DEVICE AND LIGHT-EMITTING DEVICE PACKAGE COMPRISING SAME

CROSS-REFERENCE TO RELATED PATENT APPLICATIONS

This application is a U.S. National Stage Application under 35 U.S.C. § 371 of PCT Application No. PCT/KR2016/009444, filed Aug. 25, 2016, which claims priority to Korean Patent Application No. 10-2015-0120843, filed Aug. 27, 2015, whose entire disclosures are hereby incorporated by reference.

TECHNICAL FIELD

Embodiments relate to a light-emitting device.

BACKGROUND ART

Group III-V compound semiconductors such as GaN and AlGaN are widely used for optoelectronics, electronic devices and the like, owing to many advantages such as, for example, a wide and easily adjustable band gap energy.

In particular, light-emitting devices such as light-emitting diodes or laser diodes using group III-V or II-VI compound semiconductors may realize various colors of light such as, for example, red, green, and blue light, as well as ultraviolet light, via the development of device materials and thin-film growth technique, and may also realize white light having high luminous efficacy via the use of a fluorescent material or by combining colors. These light-emitting devices have advantages of low power consumption, a semi-permanent lifespan, fast response speed, good safety, and eco-friendly properties compared to existing light sources such as, for example, fluorescent lamps and incandescent lamps.

Accordingly, the application of light-emitting devices has been expanded to a transmission module of an optical communication apparatus, a light-emitting diode backlight, which may substitute for a cold cathode fluorescent lamp (CCFL) constituting a backlight of a liquid crystal display (LCD) apparatus, a white light-emitting diode lighting apparatus, which may substitute for a fluorescent lamp or an incandescent bulb, a vehicle headlight, and a signal lamp.

A light-emitting device is provided with a light-emitting structure, which includes a first conductive semiconductor layer, an active layer, and a second conductive semiconductor layer, and a first electrode and a second electrode are respectively disposed on the first conductive semiconductor layer and the second conductive semiconductor layer. The light-emitting device emits light having energy determined by the inherent energy band of a constituent material of the active layer in which electrons injected through the first conductive semiconductor layer and holes injected through the second conductive semiconductor layer meet each other. The light emitted from the active layer may be changed depending on the composition of the constituent material of the active layer, and may be blue light, ultraviolet (UV) light, deep-UV light, or the like.

FIG. 1 is a view illustrating a light-emitting device of the related art.

The light-emitting device of a vertical type illustrated in FIG. 1, a light-emitting structure 120, which includes a first conductive semiconductor layer 122, an active layer 124, and a second conductive semiconductor layer 126, is disposed on a second electrode 136, and a first electrode 132 is disposed on the first conductive semiconductor layer 122.

In the light-emitting device of the related art, in which the active layer 124 emits light, the light emitted from the active layer 124 may be absorbed by the first electrode 132, which may deteriorate the efficiency of extraction of light.

Technical Object

Embodiments provide a light-emitting device having enhanced light extraction efficiency.

Technical Solution

In order to overcome the problem described above, one embodiment provides a light-emitting device including a light-emitting structure including a first conductive semiconductor layer, a second conductive semiconductor layer, and an active layer disposed between the first conductive semiconductor layer and the second conductive semiconductor layer, and further including a plurality of first recesses configured to penetrate the second conductive semiconductor layer and the active layer and be located in a portion of the first conductive semiconductor layer, a first electrode electrically connected to the first conductive semiconductor layer inside each of the plurality of first recesses, a conductive support substrate electrically connected to the first electrode, a second electrode electrically connected to the second conductive semiconductor layer, and an insulating layer disposed between the conductive support substrate and the second conductive semiconductor layer, wherein a second recess penetrates the first conductive semiconductor layer, the second conductive semiconductor layer, and the active layer and is located in a portion of the insulating layer.

In addition, the insulating layer may be disposed so as to extend around the first recesses.

In addition, the second recess may include a light-extractor lower-surface portion configured to form a lower surface of the second recess, a first light-extractor side-surface portion configured to form one side surface of the second recess, and a second light-extractor side-surface portion configured to form a remaining side surface of the second recess.

In addition, the light-extractor lower-surface portion may be the insulating layer.

In addition, the light-extractor lower-surface portion may be disposed to have a first width for extracting light generated in the active layer.

In addition, the first width may be equal to or greater than 3 μm.

In addition, the first light-extractor side-surface portion may be disposed to have a first angle with the insulating layer for preventing light generated in the active layer from being again absorbed into the second light-extractor side-surface portion.

In addition, the first angle may be equal to or less than 80 degrees.

In addition, a third width of a surface of each first recess may be smaller than a second width of an area in which the first recess is in contact with the first electrode.

In addition, the light-emitting structure may emit light within a UV-B or UV-C wavelength range.

In addition, in the first conductive semiconductor layer or the second conductive semiconductor layer, a composition rate of aluminum (Al) may be equal to or greater than 40%.

Another embodiment provides a light-emitting device including a light-emitting structure including a first conductive semiconductor layer, a second conductive semiconductor layer, and an active layer disposed between the first conductive semiconductor layer and the second conductive semiconductor layer, and further including a plurality of first recesses configured to penetrate the second conductive semiconductor layer and the active layer and be located in a portion of the first conductive semiconductor layer, a first electrode electrically connected to the first conductive semiconductor layer inside each of the plurality of first recesses, a conductive support substrate electrically connected to the first electrode, a second electrode electrically connected to the second conductive semiconductor layer, and an insulating layer disposed between the conductive support substrate and the second conductive semiconductor layer, wherein a second recess penetrates the first conductive semiconductor layer, the second conductive semiconductor layer, and the active layer and is located in a portion of the insulating layer, wherein the second recess includes a light-extractor lower-surface portion configured to form a lower surface of the second recess, a first light-extractor side-surface portion configured to form one side surface of the second recess, and a second light-extractor side-surface portion configured to form a remaining side surface of the second recess, wherein the light-extractor lower-surface portion has a first width for extracting light generated in the active layer, and the first width is equal to or greater than 3 μm, and wherein a third width of a surface of each first recess is smaller than a second width of an area in which the first recess is in contact with the first electrode.

A further embodiment provides a light-emitting device package including a conductive substrate provided with a cavity, and a light-emitting device disposed so that at least a portion thereof is inserted into the cavity in the conductive substrate, wherein the light-emitting device includes a light-emitting structure including a first conductive semiconductor layer, a second conductive semiconductor layer, and an active layer disposed between the first conductive semiconductor layer and the second conductive semiconductor layer, and further including a plurality of first recesses configured to penetrate the second conductive semiconductor layer and the active layer and be located in a portion of the first conductive semiconductor layer, a first electrode electrically connected to the first conductive semiconductor layer inside each of the plurality of first recesses, a conductive support substrate electrically connected to the first electrode, a second electrode electrically connected to the second conductive semiconductor layer, and an insulating layer disposed between the conductive support substrate and the second conductive semiconductor layer, wherein a second recess penetrates the first conductive semiconductor layer, the second conductive semiconductor layer, and the active layer and is located in a portion of the insulating layer.

In addition, the second recess may include a light-extractor lower-surface portion configured to form a lower surface of a light extractor, a first light-extractor side-surface portion configured to form one side surface of the light extractor, and a second light-extractor side-surface portion configured to form a remaining side surface of the light extractor.

In addition, the light-extractor lower-surface portion may be the insulating layer.

In addition, the light-extractor lower-surface portion may be disposed to have a first width for extracting light generated in the active layer.

In addition, the first width may be equal to or greater than 3 μm.

In addition, the first light-extractor side-surface portion may be disposed to have a first angle with the insulating layer for preventing light generated in the active layer from being again absorbed into the second light-extractor side-surface portion.

In addition, the first angle may be equal to or less than 80 degrees.

In addition, in the first conductive semiconductor layer or the second conductive semiconductor layer, a composition rate of aluminum (Al) may be equal to or greater than 40%.

Advantageous Effects

Light-emitting devices according to the present embodiments include a light exit structure disposed on a first conductive semiconductor layer, thereby being capable of increasing the efficiency of extraction of light generated in an active layer, and consequently having enhanced light extraction efficiency.

BEST MODE

Hereinafter, embodiments will be described in detail with reference to the accompanying drawings, in order to concretely realize the object described above.

In the description of the embodiments, when an element is referred to as being formed "on" or "under" another element, it can be directly "on" or "under" the other element or be indirectly formed with intervening elements therebetween. It will also be understood that "on" or "under" the element may be described relative to the drawings.

Light-emitting devices according to the embodiments are vertical light-emitting devices in which a first electrode, which supplies current to a first conductive semiconductor layer, is disposed below a light-emitting structure so as to reduce the amount of light that is reflected and discharged upward from the light-emitting structure, and the first electrode may penetrate a second conductive semiconductor layer and an active layer to thereby be electrically connected to the first conductive semiconductor layer.

Figure 1:
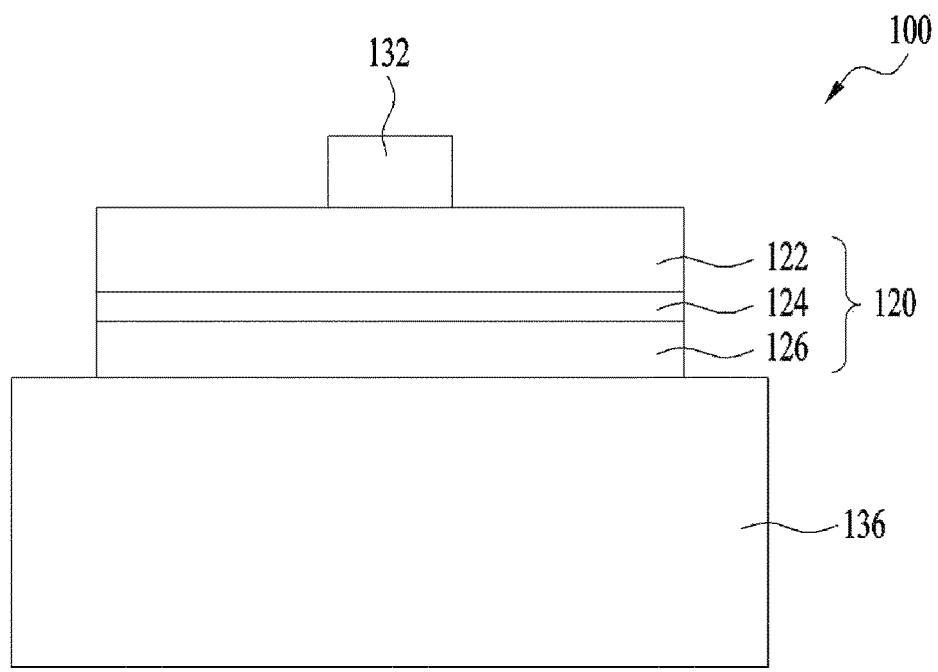
FIG. 1 is a view illustrating a light-emitting device of the related art.
Figure 2:
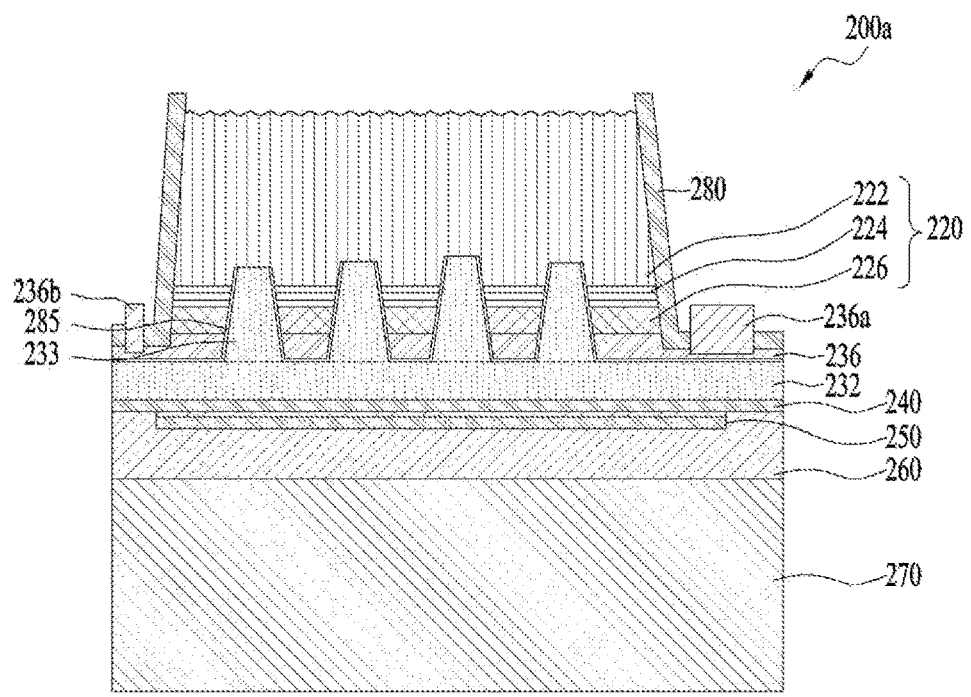
FIG. 2 is a view illustrating one embodiment of a light-emitting device.

FIG. 2 is a view illustrating a first embodiment of a light-emitting device.

In the light-emitting device 200a according to the present embodiment, a second conductor layer 236 may be disposed below a light-emitting structure 220, an insulating layer 285 and a first conductor layer 232 may be disposed below the second conductor layer 236, and through-electrodes 233, which extend from the first conductor layer 232, may be in electrical contact with a first conductive semiconductor layer 222 in the light-emitting structure 220. In addition, second electrodes 236a and 236b may be disposed in the edge area of the second conductor layer 236 so as to correspond to the edge of the light-emitting structure 220.

The light-emitting structure 220 includes a first conductive semiconductor layer 222, an active layer 224, and a second conductive semiconductor layer 226.

The first conductive semiconductor layer 222 may be formed of group III-V or II-VI compound semiconductors, or the like, and may be doped with a first conductive dopant. The first conductive semiconductor layer 222 may be formed of a semiconductor material having a composition equation of $Al_xIn_yGa(1-x-y)N (0 \leq x \leq 1, 0 \leq y \leq 1, 0 \leq x+y \leq 1)$, and for example, may be formed of any one or more of AlGaN, GaN, InAlGaN, AlGaAs, GaP, GaAs, GaAsP, and AlGaInP.

When the first conductive semiconductor layer 222 is an n-type semiconductor layer, the first conductive dopant may include an n-type dopant such as Si, Ge, Sn, Se, or Te. The first conductive semiconductor layer 222 may be formed in a single layer or in multiple layers, without being limited thereto.

The active layer 224 may be disposed between the first conductive semiconductor layer 222 and the second conductive semiconductor layer 226, and may include any one of a single well structure, a multi-well structure, a single quantum well structure, a multi-quantum-well structure, a quantum dot structure, and a quantum line structure.

The active layer 224 may have any one or more pair structures of a well layer and a barrier layer using group III-V compound semiconductors, for example, AlGaN/AlGaN, InGaN/GaN, InGaN/InGaN, AlGaN/GaN, InAlGaN/GaN, GaAs(InGaAs)/AlGaAs, and GaP(InGaP)/AlGaP, without being limited thereto. Here, the well layer may be formed of a material, which has a smaller energy band gap than the energy band gap of the barrier layer.

The second conductive semiconductor layer 226 may be formed of a semiconductor compound. The second conductive semiconductor layer 226 may be formed of, for example, group III-V or II-VI compound semiconductors, and may be doped with a second conductive dopant. The second conductive semiconductor layer 226 may be formed of a semiconductor material having a composition equation of $In_xAl_yGa1-x-yN$ ($0 \leq x \leq 1, 0 \leq y \leq 1, 0 \leq x+y \leq 1$), and may be formed of any one or more of AlGaN, GaNAlInN, AlGaAs, GaP, GaAs, GaAsP, and AlGaInP.

When the second conductive semiconductor layer 226 is a p-type semiconductor layer, the second conductive dopant may be a p-type dopant such as Mg, Zn, Ca, Sr or Ba. The second conductive semiconductor layer 226 may be formed in a single layer or in multiple layers, without being limited thereto.

When the light-emitting device 200a according to the embodiment emits light within a UV-B or UV-C wavelength range, the light-emitting structure 220 may be grown based on AlGaN, and for example, the composition rate of aluminum (Al) in AlGaN may be 40% or more. As such, light emission in a TM mode may be increased, compared to a light-emitting device that emits light within a blue wavelength range, so that light is mostly emitted in a vertical direction, which is parallel to the direction of growth of the light-emitting structure 220. At this time, due to the light extraction structure described above, it is possible to reduce re-absorption of light inside the light-emitting structure 220.

Although not illustrated, an electron blocking layer may be disposed between the active layer 224 and the second conductive semiconductor layer 226. The electron blocking layer may have the structure of a super-lattice. For example, the super-lattice may be formed by disposing AlGaN doped with a second conductive dopant and alternately disposing a plurality of GaN layers having different composition rates of aluminum.

The surface of the first conductive semiconductor layer 222 may be uneven to enhance light extraction efficiency, as illustrated.

The second conductor layer 236 may be disposed below the second conductive semiconductor layer 226. The second conductor layer 236 may be disposed in surface contact with the second conductive semiconductor layer 226, but may not be in contact in the area in which the through-electrodes 233 are formed. In addition, the edge of the second conductor layer 236 may be disposed further outward than the edge of the second conductive semiconductor layer 226, and this serves to secure the area in which the second electrodes 236a and 236b are to be disposed.

The second conductor layer 236 may be formed of a conductive material, and specifically, may be formed of a metal. More specifically, the second conductor layer may be formed in a single layer or in multiple layers using at least one of silver (Ag), aluminum (Al), titanium (Ti), chrome (Cr), nickel (Ni), copper (Cu), or gold (Au).

A passivation layer 280 may be formed around the light-emitting structure 220. The passivation layer 280 may be formed of an insulating material, and the insulating material may be a non-conductive oxide or nitride. In one example, the passivation layer 280 may be formed as a silicon oxide (SiO2) layer, an oxide nitride layer, or an oxide aluminum layer.

The passivation layer 280, which is disposed around the light-emitting structure 220, may also be disposed on the edge of the second conductor layer 236, which is disposed further outward than the edge of the second conductive semiconductor layer 226 described above. The passivation layer 280 disposed on the edge of the second conductor layer 236 may be opened in the area in which the second electrodes 236a and 236b are formed.

The first conductor layer 232 may be disposed below the second conductor layer 236 with the insulating layer 285 interposed therebetween. The first conductor layer 232 may be formed of a conductive material, and specifically, may be formed of a metal. More specifically, the first conductor layer may be formed in a single layer or in multiple layers using at least one of silver (Ag), aluminum (Al), titanium (Ti), chrome (Cr), nickel (Ni), copper (Cu), or gold (Au).

The plurality of through-electrodes 233 may be disposed so as to extend upward from the first conductor layer 232. The through-electrodes 233 may penetrate the insulating layer 285, the second conductor layer 236, the second conductive semiconductor layer 226, and the active layer 224 and may extend to a portion of the first conductive semiconductor layer 222 so that the upper surfaces of the through-electrodes 233 may be in surface contact with the first conductive semiconductor layer 222.

Each through-electrode 233 may have a circular or polygonal cross-section. The above-described insulating layer 285 may be disposed so as to extend around the through-electrode 233, thereby electrically insulating the through-electrode 233 from the second conductor layer 236, the second conductive semiconductor layer 226, and the active layer 224.

In FIG. 2, an ohmic layer 240 may be disposed below the first conductor layer 232. The ohmic layer may be disposed between the first conductor layer 232 and the first conductive semiconductor layer 222, or between the second conductor layer 236 and the second conductive semiconductor layer 226.

The ohmic layer 240 may have a thickness of about 200 Å. The ohmic layer 240 may be formed using at least one of indium tin oxide (ITO), indium zinc oxide (IZO), indium zinc tin oxide (IZTO), indium aluminum zinc oxide (IAZO), indium gallium zinc oxide (IGZO), indium gallium tin oxide (IGTO), aluminum zinc oxide (AZO), antimony tin oxide (ATO), gallium zinc oxide (GZO), IZO Nitride (IZON), Al—GaZnO (AGZO), In—GaZnO (IGZO), ZnO, IrOx, RuOx, NiO, RuOx/ITO, Ni/IrOx/Au, Ni/IrOx/Au/ITO, Ag, Ni, Cr, Ti, Al, Rh, Pd, Ir, Sn, In, Ru, Mg, Zn, Pt, Au, or Hf, without being limited to these materials.

A reflective layer 250, which may act as a reflective electrode, may be disposed below the ohmic layer. The reflective layer 250 may be formed as a metal layer using tungsten (W), titanium (Ti), molybdenum (Mo), aluminum (Al), silver (Ag), nickel (Ni), platinum (Pt), rhodium (Rh), or an alloy containing Al, Ag, Pt or Rh. Aluminum, silver, or the like may effectively reflect light, which is directed from the active layer 224 downward in FIG. 2, thereby considerably enhancing the light extraction efficiency of a semiconductor element.

The width of the reflective layer 250 may be smaller than the width of the ohmic layer 240, and a channel layer 260 may be disposed below the reflective layer 250. The width of the channel layer 260 may be greater than the width of the reflective layer 250 so that the channel layer may be disposed so as to surround the reflective layer 250. The channel layer 260 may be formed of a conductive material, and for example, may be formed of gold (Au) or tin (Sn).

A conductive support substrate 270 may be formed of a conductive material such as a metal or a semiconductor material. The conductive support substrate may be formed using a metal having excellent electrical conductivity or thermal conductivity, and may be formed using a highly thermally conductive material (e.g. a metal) because it is necessary to sufficiently dissipate heat generated during operation of a semiconductor element. For example, the conductive support substrate may be formed of a material selected from among the group consisting of molybdenum (Mo), silicon (Si), tungsten (W), copper (Cu), and aluminum (Al), or an alloy thereof. In addition, the conductive support substrate may selectively include gold (Au), copper (Cu) alloy, nickel (Ni), copper-tungsten (Cu—W), a carrier wafer (e.g. GaN, Si, Ge, GaAs, ZnO, SiGe, SiC, SiGe, Ga2O3 or the like), or the like.

The support substrate 270 may be formed to a thickness ranging from 50 µm to 200 µm in order to have sufficient mechanical strength for effectively dividing an entire nitride semiconductor into separate chips via a scribing process and a breaking process without bending the semiconductor.

Although not illustrated, a bonding layer may bond the channel layer 260 to the conductive support substrate 270, and may be formed of a material selected from the group consisting of gold (Au), tin (Sn), indium (In), aluminum (Al), silicon (Si), silver (Ag), nickel (Ni), and copper (Cu), or an alloy thereof.

In the light-emitting device 200a according to the present embodiment, current is uniformly supplied from the first conductor layer 232 to the entire area of the first conductive semiconductor layer 222 through the through-electrode 233, and current may be uniformly supplied to the entire area of the second conductive semiconductor layer 226, which is in surface contact with the second conductor layer 236. In addition, the second electrodes 236a and 236b may be disposed on the second conductor layer 236 around the light-emitting structure 220 so that current is uniformly supplied to the entire area of the second conductor layer 236.

Thus, the frequency at which electrons injected through the first conductive semiconductor layer 222 and holes injected through the second conductive semiconductor layer 226 are combined with each other in the active layer 224 may increase, which may increase the quantity of light discharged from the active layer 224.

Figure 3:
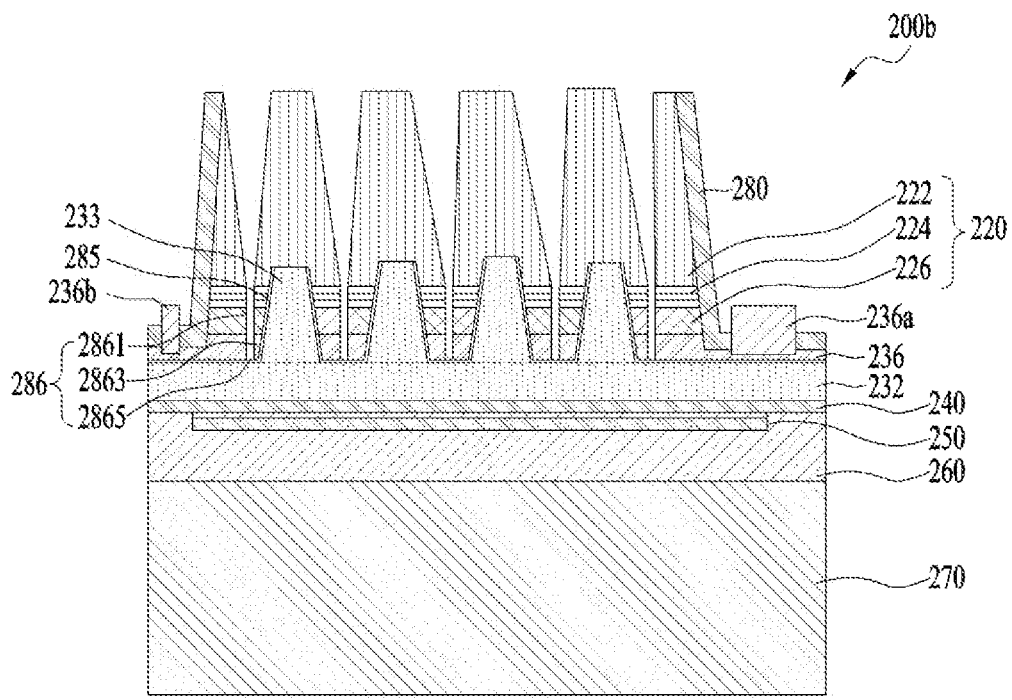
FIG. 3 is a view illustrating another embodiment of a light-emitting device.

FIG. 3 is a view illustrating another embodiment of a light-emitting device.

The light-emitting device 200b according to the present embodiment is similar to the embodiment of FIG. 2, but differs in terms that a first recess penetrates the second conductive semiconductor layer 226 and the active layer 224 and is disposed in a portion of the first conductive semiconductor layer 222, and a second recess penetrates the first conductive semiconductor layer 222, the second conductive semiconductor layer 226, and the active layer 224 and is disposed in a portion of the insulating layer 285.

The first recess may be the edge of each through-electrode, which is formed, from the lower side of the light-emitting structure, in the insulating layer 285, the second conductor layer 236, the second conductive semiconductor layer 236, the active layer 224, and a portion of the first conductive semiconductor layer 222. The through-electrode 233 and the first conductor layer 232 may be formed of the same material. The through-electrode 233 and the first conductor layer 232 may form a first electrode.

In addition, the first conductor layer 232 may act as a first electrode, and the conductive support substrate 270 may be electrically connected to the first electrode 233.

The second recess may penetrate, from the upper side of the light-emitting structure, the first conductive semiconductor layer 222, the active layer 224, and the second conductive semiconductor layer 226 so as to expose the insulating layer 285, and may act as a light extractor 286.

The light extractor 286 may be formed by convex and concave portions of the surface of the first conductive semiconductor layer 222. The convex portions may be disposed to correspond to the above-described through-electrode 233, and the concave portions may be formed to correspond to the area between the respective through-electrodes 233.

The concave portions may also be formed in one surface of the insulating layer 285.

In other words, the light extractor 286 may include a light-extractor lower-surface portion 2865, which forms the lower surface of the light extractor 286, a first light-extractor side-surface portion 2861, which forms one side surface of the light extractor 286, and a second light-extractor side-surface portion 2863, which forms the other side surface of the light extractor 286. The light-extractor lower-surface portion 2865 may be formed of the insulating layer 285.

More specifically, the insulating layer 285 that is disposed in the area between the through-electrodes 233 of the light-emitting device 200a according to the embodiment illustrated in FIG. 2 may be disposed so as to be in surface contact with the second conductor layer 236, whereas the insulating layer 285 that is disposed in the area between the through-electrodes 233 of the light-emitting device 200b according to the embodiment illustrated in FIG. 3 may be disposed so as to be opened, rather than being in surface contact with the second conductor layer 236.

Each of the first light-extractor side-surface portion 2861 and the second light-extractor side-surface portion 2863 may include all of the first conductive semiconductor layer 222, the active layer 224, and the second conductive semiconductor layer 226, and both the first light-extractor side-surface portion 2861 and the second light-extractor side-surface portion 2863 are mesa-etched so that the active layer 224 is opened. Therefore, the light generated in the active layer 224 may be more efficiently extracted to the outside of the light-emitting device 200b, which may increase the light extraction efficiency of the light-emitting device 200b.

In other words, when one surface of the active layer 224 is mesa-etched, the light generated in the active layer 224 is extracted to the outside of the light-emitting device 200, rather than being absorbed and/or reflected by the first conductive semiconductor layer 222, and therefore, the light extraction efficiency of the light-emitting device 200 may be increased.

The light extractor 286 in the present embodiment is illustrated as being provided in all of the areas between the through-electrodes 233, but this merely illustrates one embodiment. The light extractor is not limited to the embodiment illustrated in FIGS. 3 and 4 so long as it can extract the light generated in the active layer 224 to the outside of the light-emitting device 200, and the shape and number of light extractors 286 may be set differently depending on user need and does not limit the scope of the disclosure.

Figure 4:
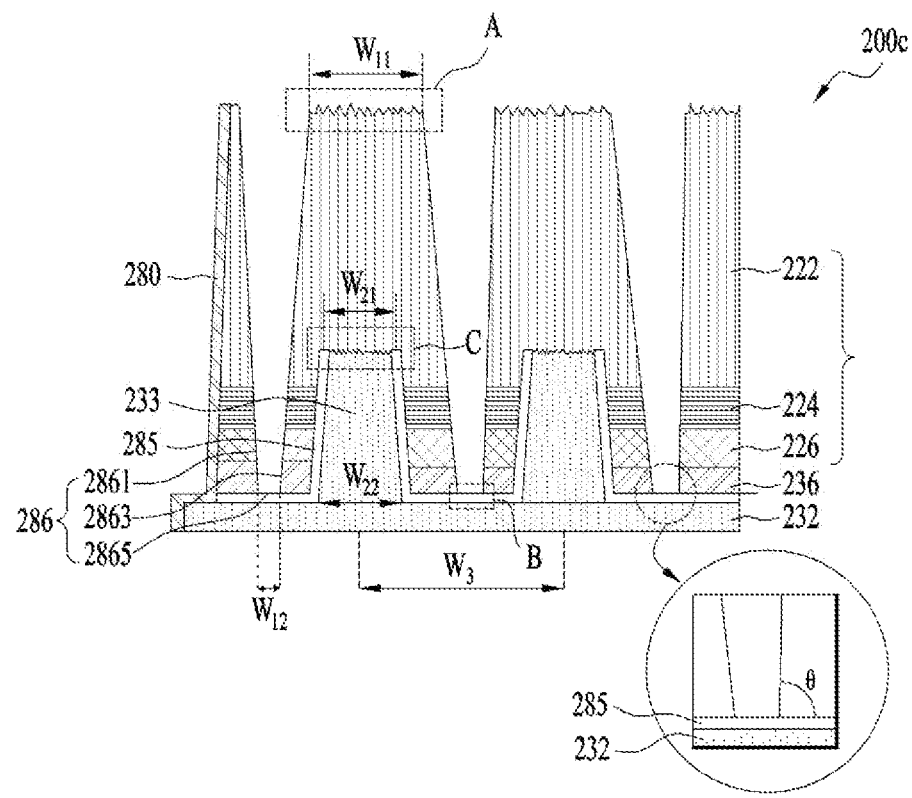
FIG. 4 is a view illustrating a light-emitting structure of FIG. 3 in detail.
Figure 5A:
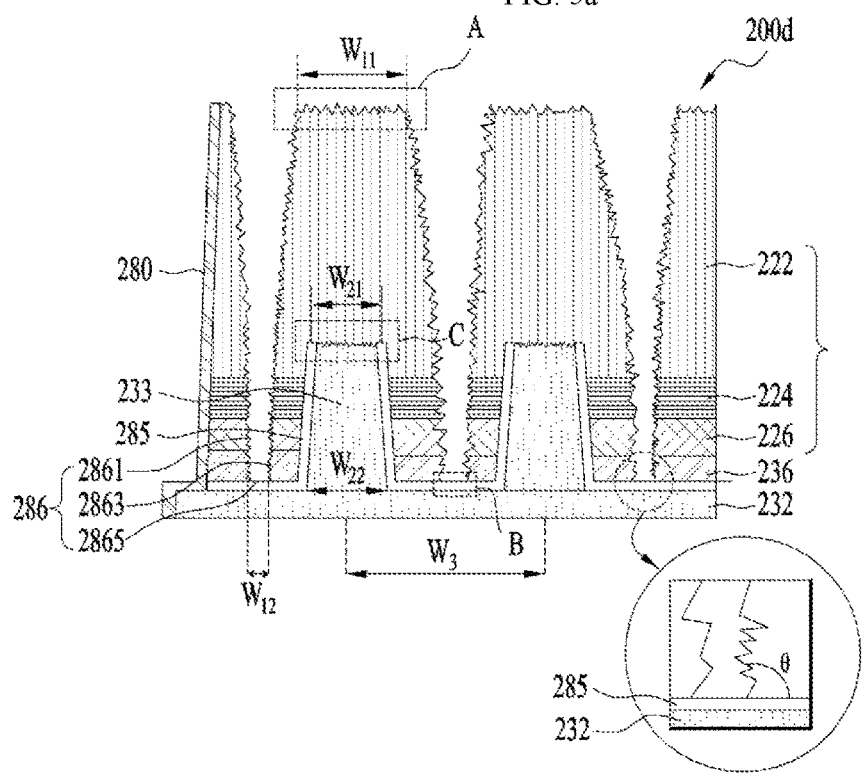
FIGS. 5a to 5d are views illustrating various embodiments of the light-emitting structure of FIG. 4, FIGS. 6a and 6b are top views of the light-emitting devices of FIGS. 2 and 3.
Figure 5B:
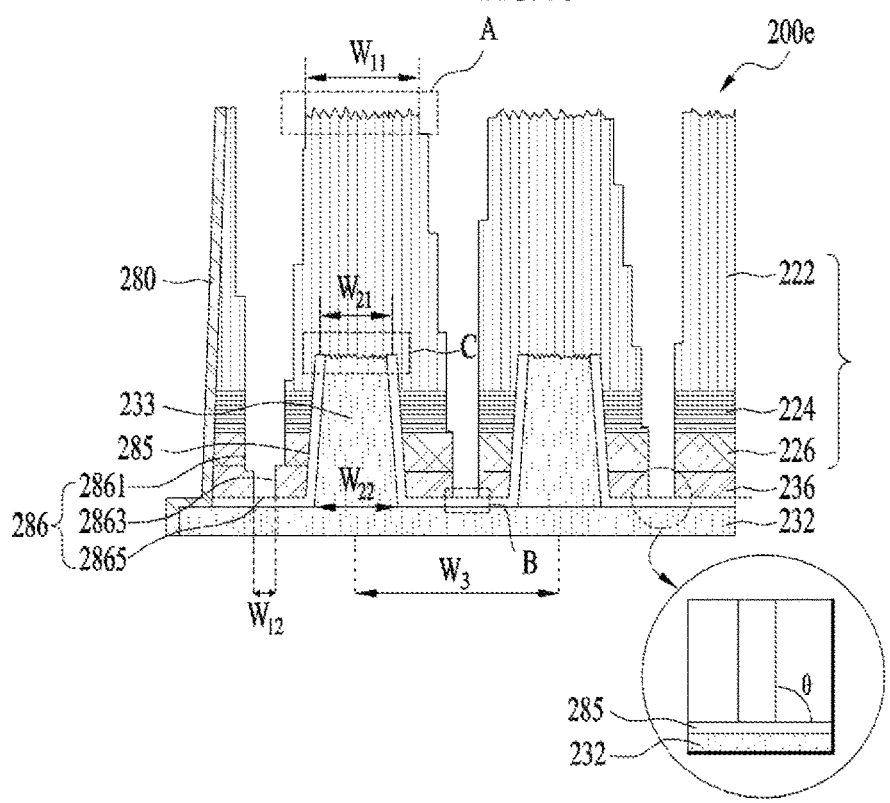
Figure 5C:
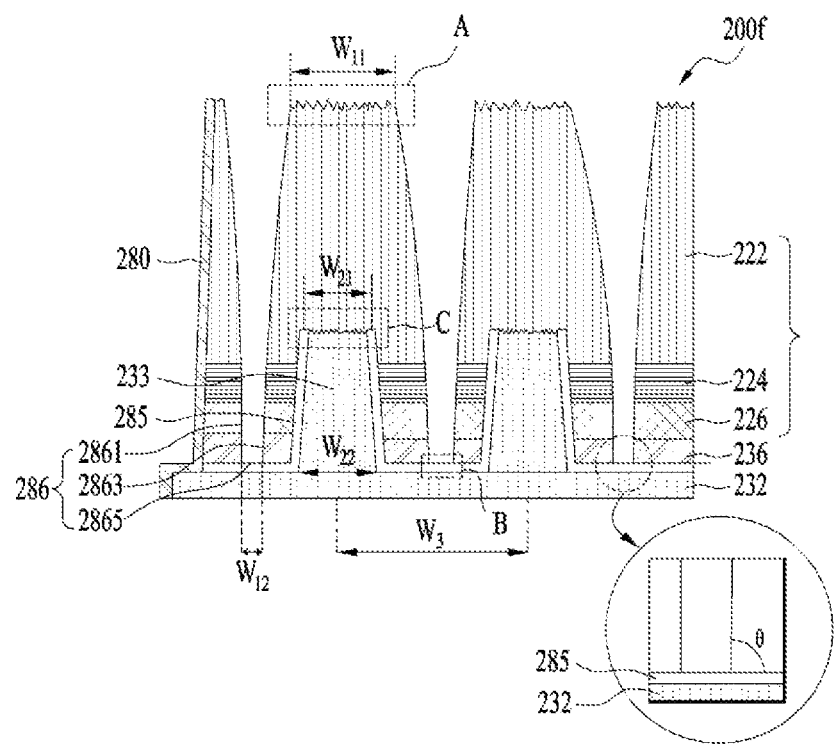
Figure 5D:
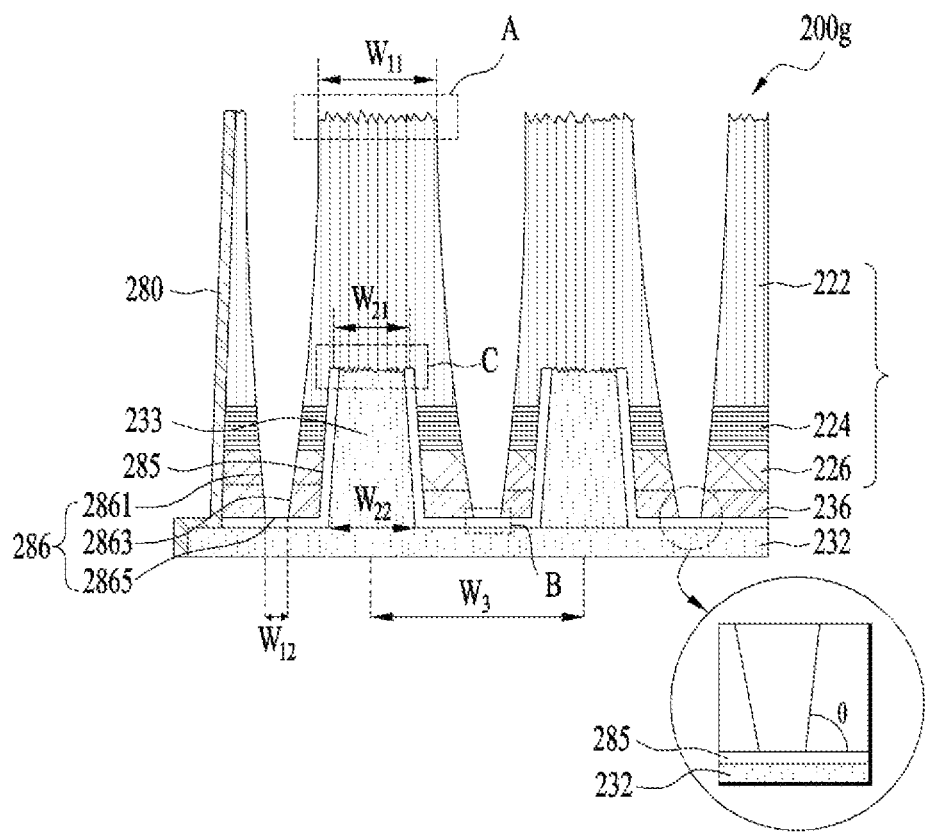

FIG. 4 is a view illustrating the light-emitting structure of FIG. 3 in detail.

Referring to FIG. 4, unlike the shape of the light extractor 286 including at least one inflection point on the side surface illustrated in FIG. 3, the light extractor 286 may include no inflection point on the side surface.

The area C in which the through-electrode 233 is in contact with the first conductive semiconductor layer 222 may be provided with a convex portion.

The convex portion may be formed on the surface of the first conductive semiconductor layer 222 so as to correspond to each through-electrode 233, and the concave portion may be formed in the surface of the first conductive semiconductor layer 222 so as to correspond to the area between the respective through-electrodes 233. Here, the convex and concave portions may also have uneven surfaces B and A.

A pattern defined by the convex and concave portions of the surface of the first conductive semiconductor layer 222 has regularity, but the uneven surfaces of the convex and concave portions may have irregular roughness.

In FIG. 4, the width of the convex portion may be greater than the width of the through-electrode 233. More specifically, the third width W21 of the surface of the through-electrode 233 may be smaller than the second width W22 of the area in which the through-electrode 233 is in contact with the first conductor layer 232, and the width W11 of the surface of the convex portion may be greater than the width W12 of the light-extractor lower surface portion at the height corresponding to the surface of the adjacent concave portion.

The width W11 of the surface of the convex portion may be greater than the third width W21 of the surface of the through-electrode 233, and the width W12 of the light-extractor lower surface portion at the height corresponding to the surface of the adjacent concave portion may be smaller than the second width W22 of the area in which the through-electrode 233 is in contact with the first conductor layer 232.

The width of the light-extractor lower-surface portion 2865 may have the first width W12 required to extract the light generated in the active layer 224.

In addition, the first width W12 of the light-extractor lower-surface portion 2865 may be equal to or greater than 3 μm.

When the width W12 of the light-extractor lower-surface portion is below 3 μm, it is difficult to outwardly extract the light generated in the active layer 224. Therefore, the aforementioned width range may ensure enhanced light extraction efficiency.

The distance W3 between the centers of the through-electrodes 233 may range from 50 μm to 200 μm.

When the distance W3 between the centers of the through-electrodes 233 is below 50 μm, the area of the active layer 224 in which light is generated in practice may be reduced, which may cause reduced light extraction efficiency.

In addition, when the distance W3 between the centers of the through-electrodes 233 is above 200 μm, the current spreading characteristics of the first conductive semiconductor layer 222 may be reduced, which may cause reduced light extraction efficiency.

Thus, through the provision of the distance W3 between the centers of the through-electrodes 233 ranging from 50 μm to 200 μm, it is possible to provide the light-emitting device 200 having enhanced light extraction efficiency.

A first angle between the insulating layer 285, the first light-extractor side-surface portion 2861, and the second light-extractor side-surface portion 2863 may be equal to or less than 80 degrees.

This is because, when the angle between the insulating layer 285, the first light-extractor side-surface portion 2861, and the second light-extractor side-surface portion 2863 is above 80 degrees, the light extracted through the first light-extractor side-surface portion 2861 may again be absorbed by the second light-extractor side-surface portion 2863 which may reduce light extraction efficiency.

Thus, through the provision of an angle that is equal to or less than 80 degrees between the insulating layer 285, the first light-extractor side-surface portion 2861, and the second light-extractor side-surface portion 2863, it is possible to increase the light extraction efficiency of the light-emitting device 200c.

FIGS. 5a to 5d are views illustrating various embodiments of the light-emitting structure of FIG. 4.

Referring to FIGS. 5a to 5d, the first and second light-extractor side-surface portions 2861 and 2863 of the embodiments may have various shapes.

More specifically, the first and second light-extractor side-surface portions 2861 and 2863 of the embodiments may include surfaces having roughness.

When the roughness is provided not only on the upper surface of the first conductive semiconductor layer 222, but also on the first and second light-extractor side-surface portions 2861 and 2863, the light emitted from the active layer 224 may be more efficiently extracted.

In addition, the first and second light-extractor side-surface portions 2861 and 2863 of the embodiments may have a stepped shape, a concave shape, or a convex shape.

By providing the first and second light-extractor side-surface portions 2861 and 2863 with various shapes, more efficient light extraction of the light-emitting device, and consequently, enhanced light extraction efficiency thereof may be achieved.

However, this illustrates only an embodiment, and shape of the first and second light-extractor side-surface portions 2861 and 2863 may be changed depending on user need, and does not limit the scope of the disclosure.

Figure 6A:
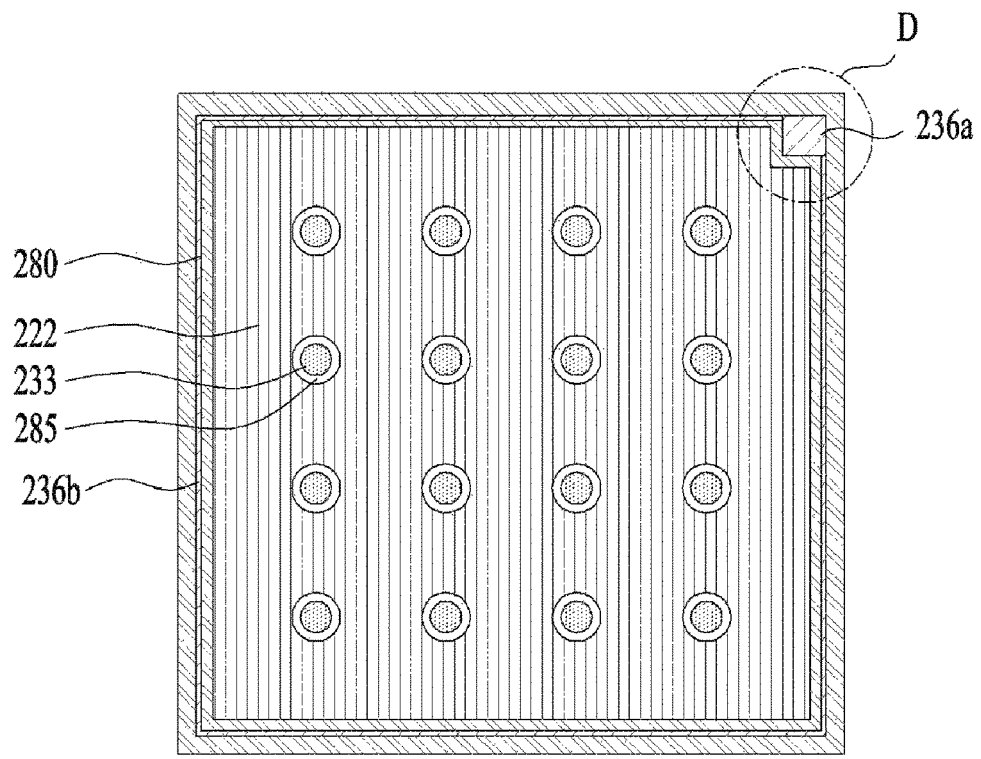
Figure 6B:
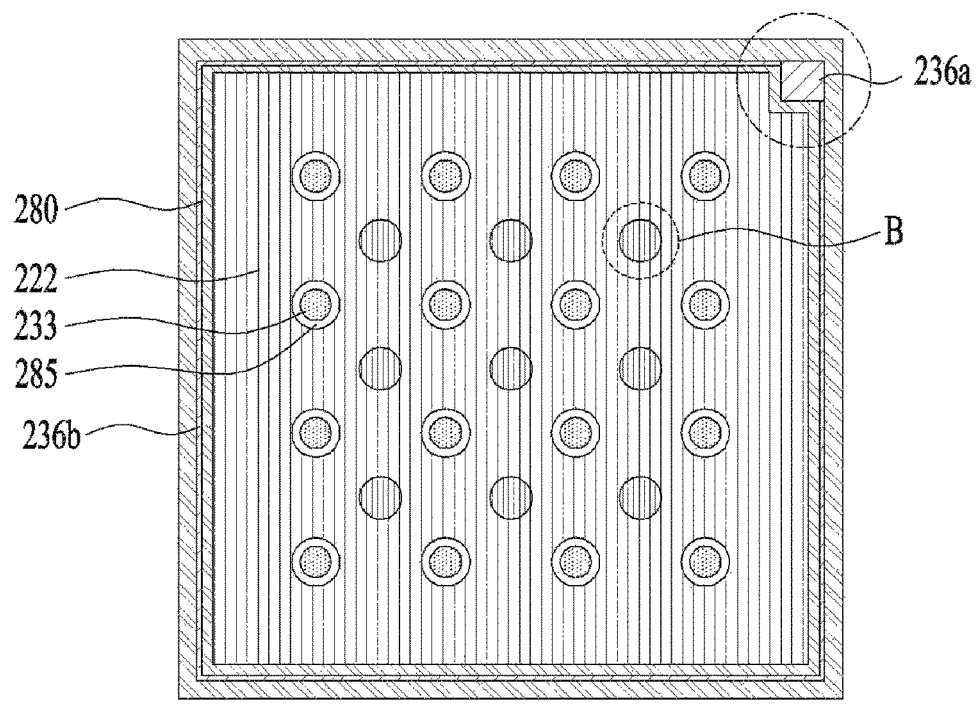

FIGS. 6a and 6b are top views of the light-emitting devices of FIGS. 2 and 3.

In FIG. 6a, the through-electrodes 233 are disposed below the first conductive semiconductor layer 222, and the insulating layer 285 is disposed around each through-electrode 233. The through-electrode 233 and the insulating layer 285 are disposed below the first conductive semiconductor layer 222, and thus cannot be seen in top views, but are illustrated for convenience of understanding.

The second electrodes 236a and 236b are disposed outside the passivation layer 280. The second electrode 236b disposed in the area "D" may have a width greater than that of the second electrode 236a disposed in the other area, and may be a wire bonding area.

Referring to the top view illustrated in FIG. 6b, a concave portion may be located in the area "B" of the surface of the second conductive semiconductor layer 222. The aforementioned concave portion may be located between the respective through-electrodes 233.

In the light-emitting devices 200a to 200g according to the above-described embodiments, the through-electrodes 233, which are continuously formed from the first conductor layer 232 to the first conductive semiconductor layer 222, are uniformly arranged in the entire area, such that current is uniformly supplied to the entire area of the first conductive semiconductor layer 222, and thus the combination of electrons and holes may be efficiently performed in the entire area of the light-emitting structure 220, which may result in enhanced luminous efficacy.

Figure 7:
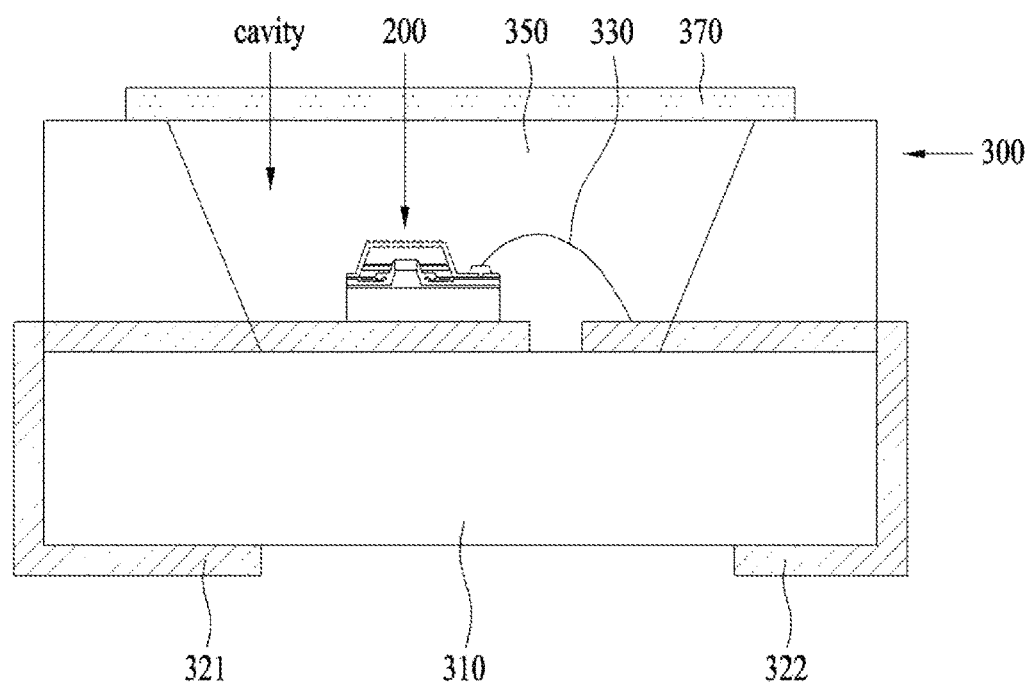
FIG. 7 is a view illustrating an embodiment of a light-emitting device package.

FIG. 7 is a view illustrating an embodiment of a light-emitting device package.

The light-emitting device package 300 according to the embodiment includes a package body 310, a first electrode part 321, a second electrode part 322, and the light-emitting device 200.

The package body 310 may have a cavity, and may be formed of an insulating material, and, for example, may be formed of polypthalamide (PPA) resin or a silicon-based material.

Each of the first electrode part 321 and the second electrode part 322 may be disposed on the package body 310 and a portion thereof may be disposed on the bottom surface of the cavity.

The light-emitting device 200 may be the above-described light-emitting device, and may be disposed on the first electrode part 321 and be electrically connected to the second electrode part 322 via a wire 330.

A molded part 350 may be disposed around the light-emitting device 200 and the wire 330. The molded part 350 may be filled with air, or may be formed of any other protective material.

In the case of the light-emitting device that emits ultraviolet light, when the molded part 350 is filled with a silicon-based material, defects such as cracks may occur in the molded part 350 due to energy corresponding to an ultraviolet wavelength, causing deterioration in reliability. The molded part 350 may include phosphors (not illustrated). The phosphors may be YAG-based phosphors, nitride-based phosphors, silicate, or mixtures thereof, without being limited thereto. A cover 370 may be disposed on top of the package 300. The cover 370 may be formed of a light-transmissive material such as glass.

In addition to the shape of the package of FIG. 7, the light-emitting device may be used in a flip-bonding package.

A plurality of light-emitting device packages according to the embodiment may be disposed on a substrate to form an array, and optical members, such as a light guide plate, a prism sheet, and a diffusion sheet may be disposed on the optical path of the light-emitting device packages. The light-emitting device packages, the substrate, and the optical members may function as a backlight unit.

In addition, a display apparatus, an indicator apparatus, and a lighting apparatus including the light-emitting device package according to the embodiment may be realized.

Here, the display apparatus may include a bottom cover, a reflector disposed on the bottom cover, a light-emitting module configured to emit light, a light guide plate disposed in front of the reflector to forwardly guide the light emitted from the light-emitting module, optical sheets including prism sheets disposed in front of the light guide plate, a display panel disposed in front of the optical sheets, an image signal output circuit connected to the display panel so as to supply an image signal to the display panel, and a color filter disposed in front of the display panel. Here, the bottom cover, the reflector, the light-emitting module, the light guide plate, and the optical sheets may construct a backlight unit.

In addition, the lighting apparatus may include a light source module having a substrate and the light-emitting device package according to the embodiment, a heat radiator configured to dissipate heat from the light source module, and a power supply unit configured to process or convert an electric signal provided from the outside so as to supply the same to the light source module. For example, the lighting apparatus may include a lamp, a headlamp, or a street light.

The head lamp may include a light-emitting module, which includes light-emitting device packages disposed on a substrate, a reflector, which reflects light emitted from the light-emitting module in a given direction, for example, in a forward direction, a lens, which forwardly refracts the light reflected by the reflector, and a shade, which blocks or reflects some of the light, which has been reflected by the reflector and directed to the lens, so as to achieve the light distribution pattern desired by a designer.

Although embodiments have been described above, the above description is merely given by way of example and is not intended to limit the disclosure, and it will be apparent to those skilled in the art that various substitutions, modifications, and alterations may be devised within the spirit and scope of the embodiments. For example, the respective constituent elements described in the embodiments may be modified in various ways. In addition, differences associated with these modifications and alterations should be interpreted as being included in the scope of the disclosure defined by the accompanying claims.

MODE FOR INVENTION

The mode for the implementation of the disclosure has been sufficiently described in "Best Mode" above.

INDUSTRIAL APPLICABILITY

A light-emitting device according to embodiments, which exhibits enhanced light extraction efficiency, may be mounted in a light-emitting device package, and may be realized as a display apparatus, an indicator apparatus, or a lighting apparatus including the light-emitting device package.

The invention claimed is:
1. A light-emitting device comprising:
a light-emitting structure comprising a first conductive semiconductor layer, a second conductive semiconductor layer, and an active layer disposed between the first conductive semiconductor layer and the second conductive semiconductor layer, and further comprising a plurality of first recesses configured to penetrate the second conductive semiconductor layer and the active layer and be located in a portion of the first conductive semiconductor layer;
a first electrode electrically connected to the first conductive semiconductor layer inside each of the plurality of first recesses;
a conductive support substrate electrically connected to the first electrode;
a second electrode electrically connected to the second conductive semiconductor layer; and
an insulating layer disposed between the conductive support substrate and the second conductive semiconductor layer,
wherein a second recess penetrates the first conductive semiconductor layer, the second conductive semiconductor layer, and the active layer and is located in a portion of the insulating layer,
wherein the second recess comprises:
a light-extractor lower-surface portion configured to form a lower surface of the second recess;
a first light-extractor side-surface portion configured to form one side surface of the second recess; and
a second light-extractor side-surface portion configured to form a remaining side surface of the second recess, and
wherein the first light-extractor side-surface portion is disposed to have a first angle with the insulating layer for preventing light generated in the active layer from being again absorbed into the second light-extractor side-surface portion.

2. The device according to claim 1, wherein the insulating layer is disposed so as to extend around the first recesses.

3. The device according to claim 1, wherein the light-extractor lower-surface portion is the insulating layer.

4. The device according to claim 3, wherein the light-extractor lower-surface portion is disposed to have a first width for extracting light generated in the active layer.

5. The device according to claim 4, wherein the first width is equal to or greater than 3 μm.

6. The device according to claim 1, wherein the first angle is equal to or less than 80 degrees.

7. The device according to claim 1, wherein a third width of a surface of each first recess is smaller than a second width of an area in which the first recess is in contact with the first electrode.

8. The device according to claim 1, wherein the light-emitting structure emits light within a UV-B or UV-C wavelength range.

9. The device according to claim 1, wherein, in the first conductive semiconductor layer or the second conductive semiconductor layer, a composition rate of aluminum (Al) is equal to or greater than 40%.

10. A light-emitting device comprising:
a light-emitting structure comprising a first conductive semiconductor layer, a second conductive semiconductor layer, and an active layer disposed between the first conductive semiconductor layer and the second conductive semiconductor layer, and further comprising a plurality of first recesses configured to penetrate the second conductive semiconductor layer and the active layer and be located in a portion of the first conductive semiconductor layer;
a first electrode electrically connected to the first conductive semiconductor layer inside each of the plurality of first recesses;
a conductive support substrate electrically connected to the first electrode;
a second electrode electrically connected to the second conductive semiconductor layer; and
an insulating layer disposed between the conductive support substrate and the second conductive semiconductor layer,
wherein a second recess penetrates the first conductive semiconductor layer, the second conductive semiconductor layer, and the active layer and is located in a portion of the insulating layer,
wherein the second recess comprises a light-extractor lower-surface portion configured to form a lower surface of the second recess, a first light-extractor side-surface portion configured to form one side surface of the second recess, and a second light-extractor side-surface portion configured to form a remaining side surface of the second recess,
wherein the light-extractor lower-surface portion has a first width for extracting light generated in the active layer, and the first width is equal to or greater than 3 μm, and
wherein a third width of a surface of each first recess is smaller than a second width of an area in which the first recess is in contact with the first electrode.

11. A light-emitting device package comprising:
a conductive substrate provided with a cavity; and
a light-emitting device disposed so that at least a portion thereof is inserted into the cavity in the conductive substrate,
wherein the light-emitting device comprises:
a light-emitting structure comprising a first conductive semiconductor layer, a second conductive semiconductor layer, and an active layer disposed between the first conductive semiconductor layer and the second conductive semiconductor layer, and further comprising a plurality of first recesses configured to penetrate the second conductive semiconductor layer and the active layer and be located in a portion of the first conductive semiconductor layer;
a first electrode electrically connected to the first conductive semiconductor layer inside each of the plurality of first recesses;
a conductive support substrate electrically connected to the first electrode;
a second electrode electrically connected to the second conductive semiconductor layer; and
an insulating layer disposed between the conductive support substrate and the second conductive semiconductor layer,
wherein a second recess penetrates the first conductive semiconductor layer, the second conductive semiconductor layer, and the active layer and is located in a portion of the insulating layer,
wherein the second recess comprises:
a light-extractor lower-surface portion configured to form a lower surface of the second recess;
a first light-extractor side-surface portion configured to form one side surface of the second recess; and
a second light-extractor side-surface portion configured to form a remaining side surface of the second recess, and
wherein the first light-extractor side-surface portion is disposed to have a first angle with the insulating layer for preventing light generated in the active layer from being again absorbed into the second light-extractor side-surface portion.

12. The package according to claim 11, wherein the light-extractor lower-surface portion is the insulating layer.

13. The package according to claim 12, wherein the light-extractor lower-surface portion is disposed to have a first width for extracting light generated in the active layer.

14. The package according to claim 13, wherein the first width is equal to or greater than 3 μm.

15. The package according to claim 11, wherein the first angle is equal to or less than 80 degrees.

16. The package according to claim 11, wherein, in the first conductive semiconductor layer or the second conductive semiconductor layer, a composition rate of aluminum (Al) is equal to or greater than 40%.

17. The device according to claim 10, wherein the light-emitting structure emits light within a UV-B or UV-C wavelength range.

18. The device according to claim 10, wherein in the first conductive semiconductor layer or the second conductive semiconductor layer, a composition rate of aluminum (Al) is equal to or greater than 40%.

19. The device according to claim 11, wherein in the first conductive semiconductor layer or the second conductive semiconductor layer, a composition rate of aluminum (Al) is equal to or greater than 40%.

20. The device according to claim 1, wherein a roughness is formed on at least one of an upper surface of the second conductive semiconductor layer, the first light-extractor side-surface portion and the second light-extractor side-surface portion.

* * * * *